United States Patent [19]

Ragan

[11] Patent Number: 4,885,802
[45] Date of Patent: Dec. 5, 1989

[54] WRISTWATCH RECEIVER ARCHITECTURE

[75] Inventor: Lawrence H. Ragan, Richardson, Tex.

[73] Assignee: AT&E Corporation, San Francisco, Calif.

[21] Appl. No.: 213,719

[22] Filed: Jun. 30, 1988

[51] Int. Cl.[4] .................................................. H04B 1/06
[52] U.S. Cl. .................................... 455/344; 455/45; 455/234; 455/302
[58] Field of Search ............... 455/302, 303, 306, 260, 455/347–351, 45, 234, 182, 192, 89, 90, 344; 375/97, 98, 102; 340/825.44, 311.1

[56] References Cited

U.S. PATENT DOCUMENTS 4,419,770 12/1983 Yagi et al. ............................ 455/351
4,713,808 12/1987 Gaskill et al. ......................... 370/94

OTHER PUBLICATIONS

"Radio Engineering," Terman, 1947, pp. 752–755.
"Solid State Radio Engineering," 1980, pp. 286, 295–297, Krauss et al.
T. Okanobu et al., *A Complete Single Chip AM/FM Radio Integrated Circuit*, Aug. 1982, IEEE Trans. on Consumer Electronics, vol. CE-28, No. 3, pp. 393–408.

*Primary Examiner*—Robert L. Griffin
*Assistant Examiner*—Curtis Kuntz
*Attorney, Agent, or Firm*—Klarquist, Sparkman, Campbell, Leigh & Whinston

[57] ABSTRACT

A wristwatch FM subcarrier paging receiver architecture is disclosed that overcomes the many inherent problems (such as self-oscillation, image responses, spurious local oscillator radiation and interference from entertainment programming) that are encountered in this demanding application. The disclosed architecture includes a tunable notch filter front end, an image cancelling mixer, an automatic gain control circuit, a phase detector for linear detection, frequency feedback for distortion reduction, a synthesized local oscillator, and a frequency plan which can utilize both high and low side local oscillator injection to optimize performance in anticipated interference environments.

9 Claims, 1 Drawing Sheet

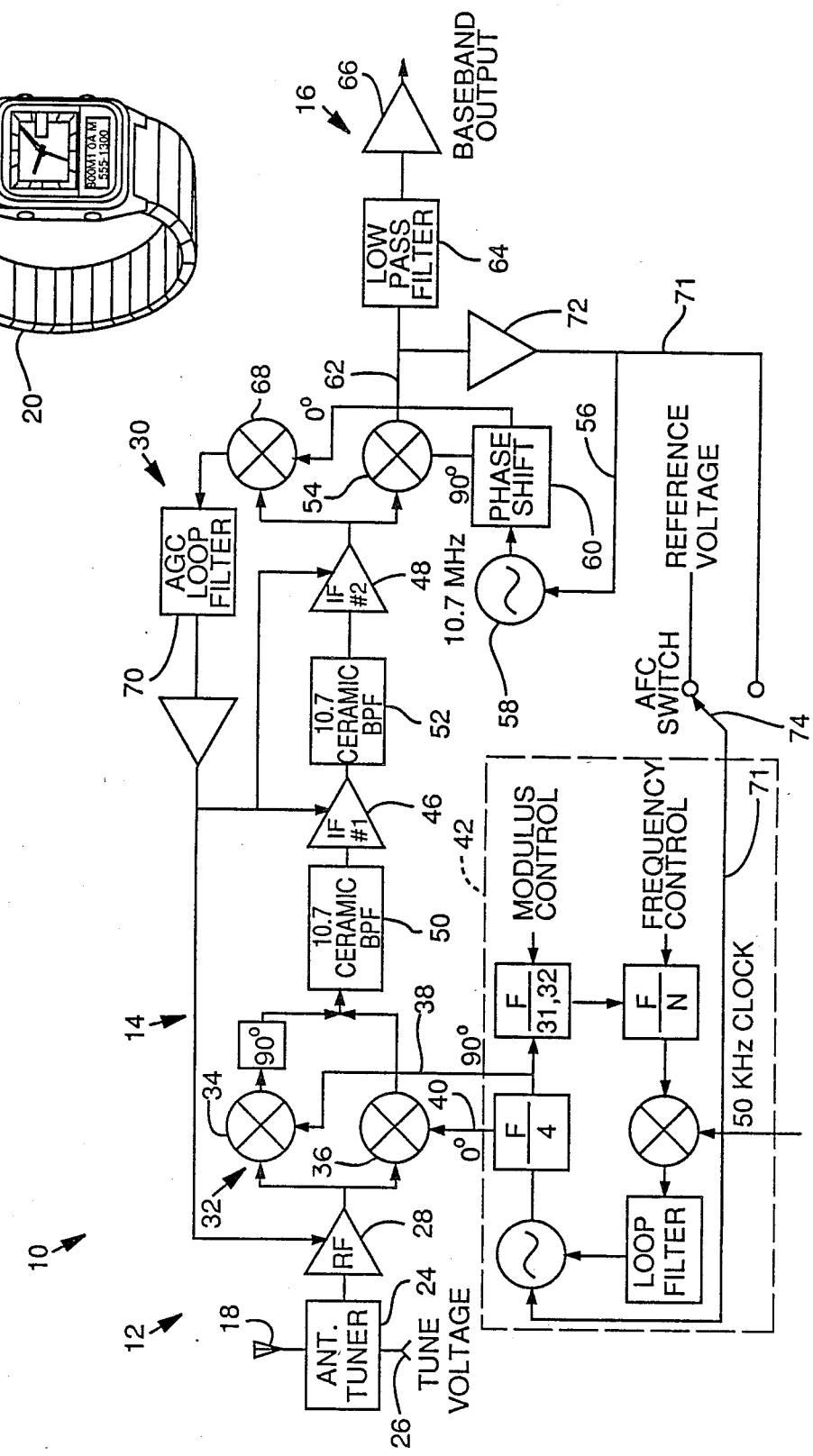

WRISTWATCH RECEIVER ARCHITECTURE

FIELD OF THE INVENTION

The present invention relates to receivers, and more particularly to FM broadcast subcarrier paging receivers adapted to be worn on a user's wrist.

BACKGROUND AND SUMMARY OF THE INVENTION

Radio paging systems are increasingly becoming part of the infrastructure of our "information age" society. No longer is their use limited to summoning doctors and emergency response technicians. Instead, they are used for virtually all communications tasks. Commonplace applications for radio paging systems now include office paging (in lieu of public address paging) and relaying grocery lists to spouses on their ways home from work.

While radio paging systems have previously been local in nature, newer systems offer virtually instant point-to-point communications anywhere on the globe. U.S. Pat. No. 4,713,808 to Gaskill et al., the disclosure of which is incorporated herein by reference, is exemplary of such new global paging technology.

Before radio paging systems can become truly ubiquitous, the receiving technology used in the personal paging receivers must be improved, both in convenience and technological sophistication. Traditionally, paging receivers have been box-like devices that must be clipped to a belt. More recently, pocket pagers have been developed. However, both of these two approaches still require the user to carry an additional item on his or her person.

More promising is the approach disclosed in the Gaskill patent in which a pager is incorporated into a conventional electronic wristwatch. Although much more convenient than prior art paging receivers, the patented Gaskill system confronts several technical challenges.

One is the reception of very low level signals. The preferred embodiment of the exemplary Gaskill system encodes the paging signals on a subcarrier of a conventional FM broadcast transmission. While the effective radiated power of such broadcasts is often quite high, wristwatch paging receivers are constrained to use antennas of very limited effective aperture (typically the wristband of the watch). Consequently, the signals they receive are inherently quite small in magnitude. Furthermore, these wristwatch receivers must be able to operate in areas of fringe FM reception.

A related difficulty is feedback. A wristwatch receiver must amplify the weak signal obtained by its small antenna tens of billion-fold if the signal is to be adequately decoded by a pager decoder. While such amplification ratios have been achieved in conventional prior art receivers, the small physical size of the wrist mounted receiver (typically less than one inch square) makes the avoidance of feedback a very difficult task. Obtaining the requisite isolation between input and output is further exacerbated by the VHF frequencies at which the exemplary Gaskill system operates (typically 100 megahertz). At these frequencies, normally negligible stray capacitances become substantial and provide undesired feedback paths.

Still another difficulty with FM subcarrier wristwatch paging receivers is that of obtaining the requisite degree of selectivity. This function is performed by the baseband decoder circuitry but requires that the preceding stages exhibit a high degree of phase linearity. Since the paging signals have a relatively low spectral power density but are broadcast immediately adjacent entertainment programming (which has a high spectral power density), there is a problem of mixing if the phase is not kept linear. That is, the entertainment signal (which is lower in frequency than the subcarrier signal) may create spectral components in the subcarrier band by harmonic generation or "cross-modulation" from third order non-linearities. Such spurious components can interfere with the decoding of the low spectral density paging signals.

A related problem is that of spurious mixer products. This problem, which is present in all receivers, is exacerbated here by two factors. One is that the receiver operates in a frequency band in which it is inundated with high power broadcast signals on adjacent channels. Another is that certain of the spurious mixer responses pose a potential threat to aircraft navigation systems. These mixer issues are discussed in greater detail below.

Most FM receiving systems use the heterodyne principle to simplify selection of a desired signal and rejection of undesired signals. The mixers utilized in heterodyning are imperfect. These imperfections allow unwanted signals to produce responses in the receiver that can interfere with reception of the wanted signal. A "perfect" mixer is one which produces a signal at its output whose angle (both frequency and phase) is the sum or difference of the incoming signal and the local oscillator. The output of this "perfect" mixer contains no other signals. The three deviations from this ideal which must be dealt with by receiver designers are called "spurious responses," "image responses" and "intermodulation."

In order to produce frequencies at its output that are not present at its input, a mixing device must be nonlinear. The transfer functions of nonlinear devices can be described as a power series of terms relating the output to the input. If the output is called O(t) and the input is I(t), the output can be expressed as:

$$O(t) = a_1 I(t) + a_2 [I(t)]^2 + a_3 [I(t)]^3 + \ldots$$

If the input consists of two signals, $I(t) = i_1(t) + i_2(t)$, signals at many different frequencies will be present at the output. The desired frequency is a result of the second order term, which, in addition to providing the square of both input signals (which produces signals at twice the frequency of each input signal and at DC) provides the product of the input terms (which produces signals at the sum and difference frequencies). The higher order terms produce signals at $m*f_1 \pm n*f_2$, where m and n are integers and $f_1$ and $f_2$ are the frequencies of the two input signals.

Considering the case where one of the input signals is the local oscillator and the other is an undesired signal, it will be recognized that the undesired signal may produce outputs (by means of the third and higher order terms) at the intermediate frequency. It is these higher order undesired signals that are termed spurious responses.

Although a complete treatment of the spurious response phenomenon is beyond the scope of this discussion, some generalizations are in order. First, virtually all nonlinear devices are properly characterized by power series expansions where the $a_i$ terms decrease rapidly with increasing i, so higher order terms have responses that are lower in amplitude than the second order, desired term. Experience has shown that, except for systems that require very high dynamic range, consideration of responses to the eighth or tenth order is sufficient to assure "spurious free" operation.

Performance of mixers can be improved if a transfer characteristic can be designed in which the value of the $a_2$ coefficient is substantially enhanced in relation to all other $a_i$ terms. Certain semiconductor types exhibit this "square law" characteristic.

The second interference mechanism, the "image response," occurs due to the sum and difference frequencies generated by multiplying the two inputs to the mixer. It is produced by the same second order terms as produce the desired response and, as such, cannot be attenuated by careful design to achieve ideal "square law" performance. The image response is typically of equal magnitude to the desired response, for a given level of signal strength at the desired and image frequencies. The image is the "other difference" frequency response of the mixer. When the desired signal frequency is below the local oscillator frequency, the image frequency is above the local oscillator frequency by the same amount.

The U.S. FM broadcast spectrum extends from 88 to 108 megahertz. Because the IF used in most FM receivers is 10.7 megahertz, no image frequencies fall within the FM broadcast band. (The nearest image is at 109.4 megahertz, caused when the local oscillator is tuned to 98.7 megahertz to receive a broadcast at 88 megahertz, placing the image at 98.7 plus 10.7). The image band at 109.4 megahertz and above is entirely within the aeronautical navigation and communication band. The frequencies up to 118 megahertz (corresponding to images of FM frequencies up to 96.6 megahertz) are used for transmission of aeronautical navigation signals by ground based stations. Aircraft transmitters do not use these frequencies. The ground based navigation stations are widely dispersed across the country (probably no more than ten in the vicinity of any metropolitan area), are relatively low in power (on the order of a few hundred watts), and are beamed skyward. The remaining frequencies in the image band are devoted to ground-to-air and air-to-air communications. The transmitters in aircraft are the most likely interference from this service, except in highly localized areas near airports or other transmitting points. The aircraft transmitters are low power (typically less than 25 watts) and are used intermittently.

There is not enough frequency separation between the image band and the desired signal band to allow fixed filtering of the image band from the input to the mixer if the receiver size is to be kept small enough to be wrist mounted. Consequently, one embodiment of the present invention uses a tunable notch filter for image rejection. Tuning the filter across the input frequency range in synchronism with tuning of the local oscillator is not a simple task if the filter is designed to have substantial rejection to the image frequencies.

Local oscillator leakage from a down conversion receiver can also be a significant problem, especially in the present circumstances, since the local oscillator tunes across the navigation band. An aircraft relying on navigation signals from one or more distant transmitters must receive very weak signals effectively in order to decode the required navigational information. The nature of the navigation systems is such that interference can cause substantial errors in the output information. Pilots dependent on this erroneous information during poor weather or other adverse conditions could conceivably fly their aircraft into mountains or other obstructions with tragic consequences. (Portable FM receivers, in addition to meeting stringent local oscillator radiation specifications, carry warnings against use onboard aircraft.)

To minimize the problem of local oscillator interference with aeronautical services, the receiver of the present invention (in addition to employing sound design techniques and complying with applicable FCC standards) energizes the local oscillator for no more than a few milliseconds every several seconds of operation, as more fully described in the Gaskill patent. Thus, the little stray local oscillator energy that may be radiated from the receiver does not interfere with this radio navigation service.

The third and final mixer interference mechanism, "intermodulation," is a nonlinear effect in which two unwanted signals interact to interfere with reception of the desired signal. As noted earlier, nonlinearities cause mixer outputs at $m^*f_1 \pm n^*f_2$, where m and n are integers, and $f_1$ and $f_2$ are frequencies of two input signals. If two signals are separated from one another in frequency by the same frequency difference as exists between the one closest to a desired signal and the desired frequency, the nonlinear mixing of these two signals can produce an output at the desired frequency. It turns out that all odd-ordered (where m + n is an odd number) nonlinearities can produce intermodulation products. The higher order products are typically not as strong as the third order one.

Often the mixer is the limiting facto in intermodulation performance, since it is a device which is deliberately operated in a highly nonlinear fashion. In the mixer, however, it is not the third and other odd order terms in the transfer characteristic, but the fourth and other even order terms which cause intermodulation responses. It is possible to configure a mixer so that it is balanced either to odd order or even order responses to thereby obtain some subtraction of undesired responses. However, since the second order term is required for mixer operation, and other even ordered terms give rise to the intermodulation responses, it is not feasible to obtain rejection of intermodulation problems through simple balancing techniques.

The FM broadcast band, at least in the United States, is typically crowded with maximum power stations in the geographic areas where the receiver may be used. Since FM broadcast is a channelized service, the frequency of the intermodulation interference is guaranteed to be centered on the desired channel.

The spectral width of the interference, assuming both interfering stations are modulated with completely uncorrelated entertainment programming material, will be 2.82 times the spectral width of a typical FM station. This spreading effect is due to the addition of one signal whose angle is multiplied by two, being statistically combined with one whose angle is not multiplied in the intermodulation process. (It is also a result of the nature of wideband FM, where doubling the deviation doubles the spectral width.) This effect will assure that spectral energy from entertainment on the interfering signals will exist in significant proportion in the spectrum occupied by the signals that ar desired to be received.

In view of the foregoing interference mechanisms, a need existed for a method to optimize mixer performance in the receiver of the present invention. Two techniques were ultimately adopted in the present invention: image cancellation and transfer function improvement.

Image cancelling mixers use quadrature channels to cancel the image, which is received as the input spectrum inverted about the local oscillator. The input consists of a desired signal at an angular frequency $\omega_1$, an undesired signal at the image frequency $\omega_2$ and a local oscillator at a frequency $\omega_0$. (The following assumes $\omega_1 < \omega_0 < \omega_2$.)

The two local oscillator drives are 90 degrees out of phase, as denoted by sine $\omega_0 t$ and cosine $\omega_0 t$. Taking only the difference terms from the second order nonlinearity, output from the mixer driven by cosine $\omega_0 t$ is:

$$\cos(\omega_0 - \omega_1)t + \cos(\omega_0 - \omega_2)t$$

Likewise, the output of the mixer by sine $\omega_0 t$ is:

$$\sin(\omega_0 - \omega_1)t + \sin(\omega_0 - \omega_2)t$$

Rearranging the order of the second term of the first equation to obtain a positive argument:

$$\cos(\omega_0 - \omega_1)t + \cos(\omega_2 - \omega_0)t$$

Likewise, rearranging the second equation yields $$\sin(\omega_0 - \omega_1)t - \sin(\omega_2 - \omega_0)t$$

When the output of the mixer driven by $\sin\omega_0 t$, represented by the last expression, is advanced in phase by 90 degrees, the sine terms becomes cosine terms:

$$\cos(\omega_0 - \omega_1)t - \cos(\omega_2 - \omega_0)t$$

p The combined output of the two mixers is then the sum of the last two expressions:

$$2*\cos(\omega_0 - \omega_1)t$$

Thus, the image frequency term (at $[\omega_2 - \omega_0]$) is cancelled in the combined output.

The image cancelling mixer proves an excellent solution to the image problem in the present invention. The phase quadrature local oscillators can be derived by dividing the output of an actual local oscillator at twice the required local oscillator frequency. An accurate 90 degree phase shift over the narrow IF bandwidth is relatively easy to achieve. Cancellation ratios of 25 to 40 dB can be expected if the two mixers are fabricated on the same chip. Considering the low power and spectral density of potential interferers in the U.S. image band, an acceptable wrist mounted, small signal receiver can be constructed using an image cancelling mixer in a downconversion system.

The rejection of unwanted signals is further improved in the present invention by optimizing the mixer's transfer function. As was pointed out above, unwanted signals are produced by terms in the power series expansion of the nonlinear transfer function beyond second order. If a mixing device is constructed which enhances the value of the second order coefficients in relation to the higher order coefficients, improvements in mixer performance translate to larger dynamic range for the resulting receiver. Another way of stating this objective is for the mixer transfer function to conform to a "square law" characteristic very closely over the region in which it is operated. To achieve this desired square law characteristic, the present invention employs Gilbert cell multipliers in a silicon bipolar process.

From the foregoing discussion it will be recognized that the particular circumstances encountered by an FM broadcast subcarrier wristwatch receiver introduce a number of technical difficulties which must be surmounted if suitable receiver performance is to be obtained. It is a principal object of the present invention to provide a receiver architecture that overcomes the noted difficulties and is suitable for application in an FM broadcast subcarrier wristwatch receiver.

It is a more particular object of the present invention to provide a VHF wristwatch receiver that is not susceptible to self oscillation.

It is another more particular object of the present invention to provide an FM wristwatch receiver that includes an automatic gain control feature to optimize the receiver's signal-to-noise ratio and noise floor.

It is still another more particular object of the present invention to provide an FM wristwatch receiver with a detector having reduced size, cost and distortion output.

It is yet another more particular object of the present invention to provide a mixer with good square law transfer characteristics that is operable with very low battery voltages.

It is still another more particular object of the present invention to provide an FM wristwatch receiver that provides good immunity to image interference without bulky tuned circuits.

According to the preferred embodiment of the present invention, a wristwatch FM receiver suitable for paging applications is constructed on a single chip with a minimum of external components. The receiver includes a broadband RF amplifier and a phase locked loop local oscillator. A signal provided by these stages drives an image cancelling mixer to produce an IF signal. The IF amplifier chain includes two band pass filters of different design to avoid co-location of spurious filter responses. The IF and RF stages are gain controlled to optimize signal-to-noise performance. The IF chain drives a synchronous detector which includes a phase locked loop for producing a voltage signal having an instantaneous value related to the instantaneous frequency of the IF signal. This voltage signal is amplified by a baseband amplifier and its output is then low pass filtered and provided to appropriate decoder circuits for decoding a subcarrier paging signal. The baseband amplifier also provides a control signal back to both the synchronous detector and to the local oscillator to effect thereby an automatic frequency control function. All the foregoing elements are fabricated on a monolithic chip and are enclosed in a small enclosure adapted to be strapped to a user's wrist. An antenna, which may include a part or all of the wrist strap, provides RF signals to the receiver.

The foregoing and additional objects, features and advantages of the present invention will be more readily apparent from the following detailed description, which proceeds with reference to the accompanying drawings.

BRIEF DESCRIPTION OF THE DRAWINGS

FIG. 1 a block diagram of a wristwatch FM receiver according to the present invention.

FIG. 2 illustrates a wristwatch paging receiver incorporating the FM receiver of FIG. 1.

DETAILED DESCRIPTION

Referring to FIGS. 1 and 2, the preferred embodiment of the present invention 10 includes an RF stage 12, an IF stage 14 and a baseband stage 16. The RF stage 12 includes an antenna 18 which may be fabricated into the wristband 20 of a wristwatch 22 in which the receiver 10 is mounted. (A suitable wristwatch enclosure is described in the Gaskill et al. patent). The antenna 18 provides RF signals to an antenna tuner stage 24.

Antenna tuner stage 24 can be a varactor controlled notch filter which also performs limited impedance matching functions. A tuning voltage is applied to a tune voltage port 26 from a microprocessor based control system, such as is discussed in Gaskill et al. This voltage tunes a voltage-variable capacitor in tuner 24 which places the null of a notch filter at the image of the frequency to which the receiver is tuned. (This element of the invention can readily be omitted in alternative embodiments if image rejection is not a problem).

The antenna tuner 24 also serves a limited impedance transformation function. The antenna 18 with which the receiver 10 is used is typically a very small loop and consequently has a very small impedance. Receiver performance and noise figure are optimized if this impedance is transformed up to more closely match the input impedance of the following RF amplifier stage 28.

RF amplifier stage 28 is a low noise broadband amplifier tuned for maximum gain in the FM broadcast band (88-108 megahertz). The maximum gain of RF amplifier stage 28 is approximately 10 dB. Its actual gain is controlled by an AGC control circuit 30 discussed below. Since there is little in the way of preselector circuitry in or before the RF amplifier stage 28, the following receiver mixer stage 32 is provided with a wide band of amplified input signals.

To minimize the effect of image signals which pass the tuner stage 24, mixer stage 32 is configured in an image cancelling topology. Two individual mixers 34, 36 are driven with quadrature local oscillator signals on lines 38, 40 from a local oscillator synthesizer 42. High side injection is generally used, so the local oscillator tunes the 98.7 to 118.7 megahertz range to yield a 10.7 megahertz intermediate frequency. (In some foreign countries, the adjoining frequencies are allocated to different services and it may be desirable to use low side injection instead).

The output of the mixer 34 driven from local oscillator line 38 is delayed 90 degrees and is combined with the output of the mixer 36 that is driven from the delayed local oscillator line 40. The combination of these signals cancels any image response while reinforcing the desired signal response. Mixer 32 has a conversion gain at the desired signal frequency of approximately 7 dB.

The output of mixer stage 32 is provided to an IF chain 14 comprised of two IF amplifiers 46, 48 and two ceramic band pass filters 50, 52. Filters 50, 52 are desirably of non-identical design so as to avoid co-location of spurious filter responses within the IF pass band. The filters are of chip construction and may be of the SFEC 10.7 series manufactured by Murata. IF amplifiers 46, 48 have gains of approximately 20 dB each and filters 50, 52 have about 6 dB each of loss. The IF amplifiers 46, 48 are gain controlled, as discussed below, to optimize signal-to-noise ratio.

The output of IF chain 14 is provided to a synchronous, or coherent detector comprised of a mixer 54 injected with a 10.7 megahertz signal from a second local oscillator 58. The synchronous detection technique permits detection at a much lower signal level than would be possible if a limiter or discriminator stage was employed. Consequently, the IF stage gain can be lower than would normally be the case, thereby reducing the risk of feedback. Synchronous detection also requires fewer and simpler off-chip components than alternative detection techniques and is simpler to adjust.

The local oscillator 58 providing the 10.7 megahertz signal is locked to the frequency of the IF by a feedback circuit 56. The 10.7 megahertz signal causes the mixer 54 to yield an output signal on line 62 that is proportional to the frequency of the signal modulating the 10.7 megahertz IF. (The feedback circuit 56 causes the oscillator 58 to lock 90 degrees from the phase of the I.F. signal). This baseband frequency modulated signal is fed to a low pass filter 64 and then to a high gain baseband amplifier 66. Baseband amplifier 66 has a break point of about five kilohertz for discrimination against the left plus right FM stereo channel. This breakpoint also minimizes distortion caused by the main audio channel bleeding into the subcarrier channel. The high end roll-off breakpoint is at about 150 kilohertz. The output of the baseband amplifier 66 is provided to conventional decoder circuitry, as disclosed in the Gaskill et al. patent.

A second synchronous detector is also driven by the IF chain 14 and provides an AGC signal for application to the RF and IF gain stages. This second synchronous detector again includes a mixer 68, this one driven from the 10.7 megahertz local oscillator 58 through a 90 degree phase shifter 60. The output of this mixer 68 is thus related to the amplitude of the IF signal and can be used to gain control preceding stages.

The limiting stages found in most FM receivers were found disadvantageous in the present system. Limiting does not benefit the receiver's signal-to-noise or signal-to-interference ratio due to the low modulation index of the subcarrier being decoded. Consequently, the automatic gain control technique was employed.

The AGC circuitry 30 employed in the preferred embodiment of the present invention is disclosed in pending U.S. patent application Ser. No. 07/196,946 of Suter entitled "AGC Delay on an Integrated Circuit," the disclosure of which is incorporated herein by reference. An AGC loop filter 70 is a single RC stage with a break point at about one kilohertz. All other bypassing of AGC points is done with much higher break points so that the one pole is clearly dominant.

The illustrated embodiment of the present invention is AFC controlled. AFC is effected by a DC component on a feedback loop 71 produced by synchronous detector 54. An amplifier 72 is included to insure that the loop gain is high enough to control local oscillator drift.

The AFC loop controls the synthesized local oscillator 42 used for high side RF injection. (The feedback loop 56 to the 10.7 megahertz local oscillator 58 is part of the phase locked loop synchronous detector). The synthesized oscillator 42 responds to a DC component on the feedback loop 71 to adjust its frequency to minimize the resulting DC output from synchronous detector 54.

The AFC feature is included here not for threshold extension (which is not viable with a low modulation index), but to reduce cross-modulation of entertainment energy into the receiver's subspectrum due to distortion in the ceramic filters 50, 52. AFC of the synthesizer 42 can be disabled by a switch 74, which can be operated to apply a fixed reference voltage to the synthesizer 42 instead of the AFC signal.

In operation, a new channel is tuned as follows: with AFC off (switch 74 to "reference voltage"), the synthesizer 42 tunes the first local oscillator to the desired high side injection frequency. The synthesizer is then switched off a the same time the AFC is switched on. The AFC then maintains the correct frequency of the first local oscillator 42 during the message reception interval (until the receiver is switched off to conserve battery power).

The synthesizer is switched off in the above routine because it may cause interference. It incorporates digital dividers which create harmonics. These harmonics can interfere with either the RF or IF portions of the receiver.

Having illustrated the principles of my invention with reference to a preferred embodiment, it should be apparent that the invention can be modified in arrangement and detail without departing from such principles. Accordingly, I claim as my invention all such modifications as may come within the scope and spirit of the following claims.

I claim:

1. A wristwatch FM subcarrier receiver comprising:
   RF amplifier means for amplifying RF signals;
   local oscillator means including a phased lock loop for providing a local oscillator signal;
   image cancelling mixer means coupled to the RF amplifier means and the local oscillator means for mixing the RF signals and the local oscillator signal to produce an IF signal;
   gain controlled IF amplifier means coupled to the image cancelling mixer means for amplifying the intermediate frequency signal;
   synchronous automatic gain control means coupled to the IF amplifier means for controlling the gain of said amplifier means in response to the magnitude of its output signal;
   synchronous detector means coupled to the IF amplifier means and including a phased lock loop for producing a voltage signal having an instantaneous value related to an instantaneous frequency of the IF signal;
   baseband amplifier means coupled to the detector means for amplifying the voltage signal produced thereby;
   enclosure means for enclosing all of the aforesaid means and adapted to be strapped to a user's wrist; and
   antenna means for providing RF signals to the RF amplifier means.

2. The receiver of claim 1 in which the baseband amplifier means includes means for providing a control signal back to both the synchronous detector means and to the local oscillator means to effect thereby an automatic frequency control function.

3. The receiver of claim 1 in which the IF amplifier means includes first and second filters of different design to avoid co-location of spurious filter responses.

4. A wristwatch FM paging receiver comprising:
   RF amplifier means for amplifying RF signals;
   first quadrature local oscillator means for providing first and second quadrature local oscillator signals;
   image cancelling mixer means coupled to the IF amplifier means and the local oscillator means for mixing the RF signals and the quadrature local oscillator signals to produce an IF signal;
   gain controlled IF amplifier means coupled to the image cancelling mixer means for amplifying the IF signal;
   automatic gain control means coupled to the IF amplifier means for controlling the gain of said amplifier means in response to the magnitude of its output signal;
   synchronous detector means coupled to the IF amplifier means for producing a voltage signal having an instantaneous value related to an instantaneous frequency of the IF signal;
   baseband amplifier means coupled to the detector means for amplifying the voltage signal produced thereby;
   means for coupling an amplified signal from the baseband amplifier means to decoder circuitry that decodes paging information from a subcarrier of the amplified signal;
   enclosure means for enclosing all of the aforesaid means and adapted to be strapped to a user's wrist; and
   antenna means for providing RF signals to the RF amplifier means.

5. The receiver of claim 4 in which the baseband amplifier means includes a first breakpoint for rolling off signal components below a first frequency and a second breakpoint for rolling off signal components above a second frequency, wherein said first and second breakpoints bracket a sub-band in which a desired paging signal subcarrier is modulated.

6. The receiver of claim 4 which further includes a second oscillator means for providing an IF demodulation signal at a nominal IF frequency, and in which the automatic gain control means includes a mixer coupled to the IF amplifier means and to said second oscillator means for mixing the IF signal and the IF demodulation signal to produce an output signal for coupling to an AGC input of the gain controlled IF amplifier means.

7. The receiver of claim 6 in which the first local oscillator means and the second oscillator means are coupled to a common feedback loop to control the frequencies thereof.

8. The receiver of claim 4 which further includes an AGC loop filter interposed between the automatic gain control means and the gain controlled IF amplifier means.

9. A method of operating a wristwatch FM receiver to receive paging signals broadcast on a subcarrier of an FM broadcast signal, the receiver including a local oscillator, a mixer, an IF amplifier and a detector, the method comprising the steps:
   providing an AFC control line that controls the frequency of the local oscillator in response to either a signal output from the detector or in response to a reference voltage, depending on whether an AFC control switch is in first or second positions, respectively; and
   periodically performing the following steps:
   energizing said receiver;
   providing a reference voltage;
   switching said AFC control switch to the second position so that the frequency of the local oscillator is controlled by said reference voltage;

switching said AFC control switch to the first position so that the frequency of the local oscillator is thereafter controlled by the signal output from the detector, said detector output signal permitting the receiver to track the frequency of an FM broadcast signal received when the AFC control switch was in the second position;

maintaining said AFC control switch in the first position for the remainder of a message reception interval; and deenergizing the receiver at the conclusion of the message reception interval.

* * * * *